(12) United States Patent
Schoner et al.

(10) Patent No.: US 6,420,987 B1
(45) Date of Patent: Jul. 16, 2002

(54) HYSTERESIS IN AN OVERSAMPLED DATA CONVETER

(75) Inventors: Brian Schoner, Fremont; Darren D. Neuman, San Jose, both of CA (US)

(73) Assignee: LSI Logic Corporation, Milpitas, CA (US)

(*) Notice: Subject to any disclaimer, the term of this patent is extended or adjusted under 35 U.S.C. 154(b) by 01 day.

(21) Appl. No.: 09/524,831

(22) Filed: Mar. 14, 2000

(51) Int. Cl.$^7$ ................................................. H03M 3/00

(52) U.S. Cl. ......................................... 341/143; 341/144

(58) Field of Search ................................ 341/143, 144, 341/118, 145, 146; 375/350, 229, 247, 376, 245

(56) References Cited

U.S. PATENT DOCUMENTS

| | | | | |
|---|---|---|---|---|
| 5,392,040 A | * | 2/1995 | Hayashi | 341/143 |
| 5,420,892 A | * | 5/1995 | Okamoto | 375/350 |
| 5,727,038 A | * | 3/1998 | May et al. | 375/376 |
| 5,974,089 A | * | 10/1999 | Tripathi et al. | 375/247 |

* cited by examiner

Primary Examiner—Peguy JeanPierre
Assistant Examiner—Joseph Lauture
(74) Attorney, Agent, or Firm—Christopher P. Maiorana, P.C.

(57) ABSTRACT

An apparatus comprising a first circuit, a second circuit and a third circuit. The first circuit may be configured to generate an intermediate signal in response to an input signal and a first feedback signal. The second circuit may be configured to generate an output signal in response to the intermediate signal and a second feedback signal. The third circuit may be configured to generate the first feedback signal and the second feedback signal in response to the output signal.

20 Claims, 7 Drawing Sheets

HYSTERESIS IN AN OVERSAMPLED DATA CONVETER

FIELD OF THE INVENTION

The present invention relates to oversampled data converters generally and, more particularly, to a method and/or architecture for providing hysteresis in an oversampled data converter.

BACKGROUND OF THE INVENTION

Figure 1:
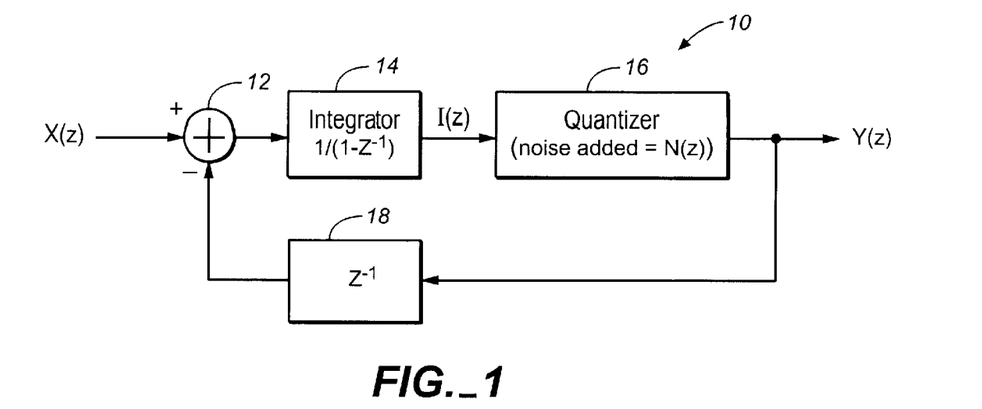
FIG. 1 is a block diagram illustrating a conventional oversampled data converter.

Referring to FIG. 1, a block diagram illustrating a 1-bit first order Sigma-Delta D/A converter 10 is shown. The converter 10 has an adder 12, an integrator 14, a quantizer 16 and a feedback network 18. Low-bitrate data converters use the low-resolution quantizer 16 at a high sampling rate. The maximum signal-to-error ratio for the converter 10 is:

$$\left(\frac{S}{E}\right)(dB) = 6.02(N + 1.5L) - 3.41$$

(where N=quantization bits, and L=octaves of oversampling).

Increasing the octaves of oversampling (L) will improve performance, with some limitations. For example, doubling the output frequency will double the power consumption at the output pin(s). However, the output pin(s) can have non-linearities.

Figure 2A:
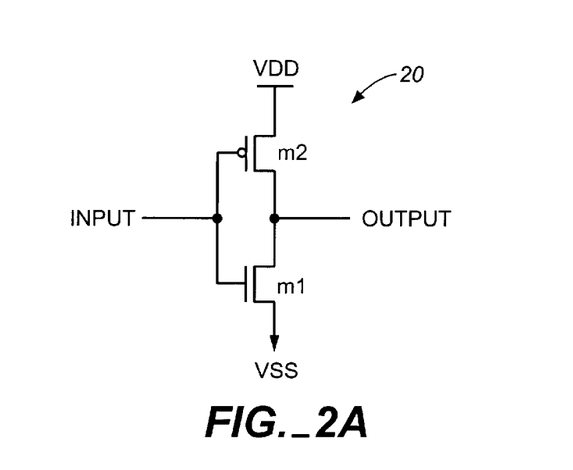
FIG. 2 is a block diagram illustrating a CMOS output driver with non-linearities.
Figure 2B:
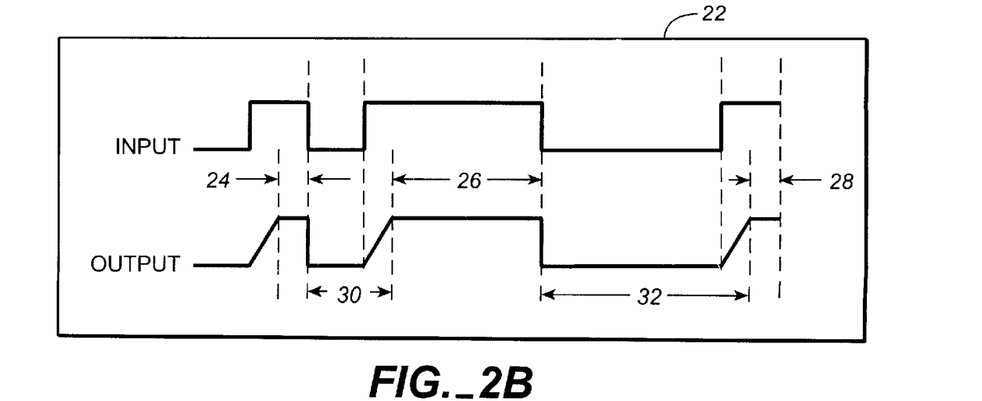

Referring to FIG. 2a, a diagram illustrating a CMOS output buffer driver 20 is shown. The CMOS driver 20 has a NMOS transistor M1 and a PMOS transistor M2. If the NMOS transistor M1 has more drive than the PMOS transistor M2, the signal OUTPUT will not be balanced. Such an unbalanced output is shown in block 22 of FIG. 2b. Each high pulse is shortened (i.e., the portions 24, 26 and 28) and each low pulse is lengthened (i.e., the portions 30 and 32). The distortion of the signal OUTPUT will add noise to the system.

Increasing the oversampling ratio of the data converter 10 will not reduce the effects of a nonlinearity in the output driver 20 of a D/A converter (or the input comparator of an A/D converter). Under some conditions, increasing the oversampling rate can actually reduce system performance by increasing the frequency of transitions. Increasing the number of transitions at the output will increase the effect of the non-linearities.

A system with reasonable performance and fewer transitions at the output pin(s) would be desirable.

SUMMARY OF THE INVENTION

The present invention concerns an apparatus comprising a first circuit, a second circuit and a third circuit. The first circuit may be configured to generate an intermediate signal in response to an input signal and a first feedback signal. The second circuit may be configured to generate an output signal in response to the intermediate signal and a second feedback signal. The third circuit may be configured to generate the first feedback signal and the second feedback signal in response to the output signal.

The objects, features and advantages of the present invention include providing an apparatus an method for implementing hysteresis in an oversampled data converter that may (i) reduce the number of transitions at the output, (ii) reduce output power, (iii) reduce effects of nonlinearities associated with transitions, and/or (iv) correct unknown nonlinearities due to fluctuation in process or temperature.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
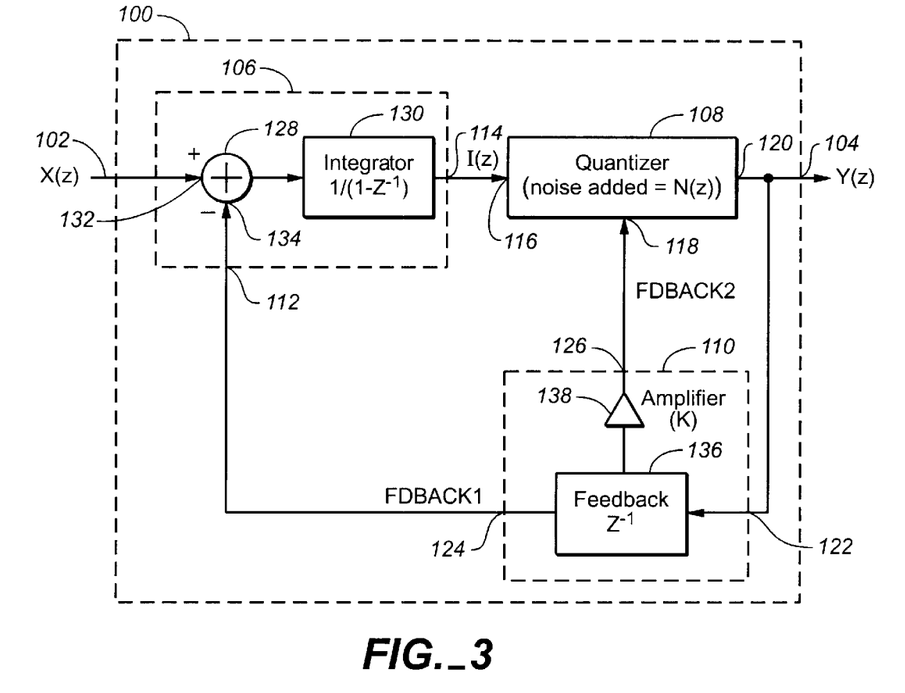
FIG. 3 is a block diagram of a preferred embodiment of the present invention.

Referring to FIG. 3, a block diagram of a circuit 100 is shown in accordance with a preferred embodiment of the present invention. The circuit 100 may be implemented, in one example, as a first or second order sigma-delta D/A converter. The circuit 100 may have an input 102 that may receive an input signal (e.g., X(z)) and an output 104 that may present an output signal (e.g., Y(z)). The circuit 100 may be configured to generate the signal Y(z) in response to the signal X(z).

The circuit 100 may comprise a circuit 106, a circuit 108, and a circuit 110. The circuit 106 may be implemented, in one example, as a sigma-delta modulator circuit. The circuit 108 may be implemented, in one example, as a quantizer circuit. The circuit 110 may be implemented, in one example, as a feedback network. The circuit 106 may have an input that may receive the signal X(z), an input 112 that may receive a feedback signal (e.g., FDBACK1) and an output 114 that may present an intermediate signal (e.g., I(z)) to an input 116 of the circuit 108. The circuit 106 may be configured to generate the signal I(z) in response to the signal X(z) and the signal FDBACK1.

The circuit 108 may have an input 118 that may receive a feedback signal (e.g., FDBACK2) and an output 120 that may present the signal Y(z). The circuit 108 may be configured to generate the signal Y(z) in response to the signal I(z) and the signal FDBACK2. During the generation of the signal Y(z), a noise signal (e.g., N(z)) may be added to the signal Y(z) by the circuit 108.

The signal Y(z) may be presented to an input 122 of the circuit 110. The circuit 110 may have an output 124 that may present the signal FDBACK1 and an output 126 that may present the signal FDBACK2. The signal FDBACK2 may be, in one example, an attenuated version of the signal FDBACK1. A predetermined amount of attenuation (e.g., K) may be selected (to be described in more detail in connection with FIGS. 4–7) to meet the design criteria of a particular implementation.

The circuit 106 may comprise, in one example, a circuit 128 and a circuit 130. The circuit 128 may be implemented, in one example, as an adder. The circuit 130 may be implemented, in one example, as an integrator. The circuit 128 may have an input 132 that may receive the signal X(z), an input 134 that may receive the signal FDBACK1, and an output that may present a signal to an input of the circuit 130. The circuit 128 may be configured, in one example, to subtract the signal FDBACK1 from the signal X(z). The circuit 130 may be configured to generate the signal I(z) in response to the signal received from the circuit 128. The circuit 130 may be configured with a particular transfer function. In one example, the circuit 130 may have a transfer function of $1/(1-Z^{-1})$. However, other transfer functions may be implemented to meet the design criteria of a particular implementation.

The circuit 110 may comprise, in one example, a circuit 136 and a circuit 138. The circuit 136 may be implemented, in one example, as a feedback network. The circuit 136 may be configured with a particular transfer function. In one example, the circuit 136 may have a transfer function of $Z^{-1}$. However, other transfer functions may be implemented to meet the design criteria of a particular implementation. The circuit 138 may be implemented, in one example, as an amplifier having a predetermined gain (e.g., K). The gain K may be selected to determine the number of transitions in the signal Y(z).

Hysteresis generally tends to keep the output 120 of the quantizer 108 at a current value. For example, implementing the quantizer circuit 108 as a 1-bit quantizer without hysteresis (e.g., setting K=0) may be described by the following relationship:

$$Y(z)=1 \text{ if } I(z)>0, \text{ else } Y(z)=-1.$$

An analysis of the relationship of the signal Y(z) to the signal X(z) when K=0 yields the following:

$$Y(z) = N(z) + \frac{X(z) - z^{-1}Y(z)}{1 - z^{-1}}$$

Solving for Y(z) provides the following:

$$Y(z)=X(z)+N(z)(1-z^{-1})$$

The quantizer noise, N(z) is generally filtered by the transfer function of the integrator 130 (e.g., $1-Z^{-1}$).

However, implementing the 1-bit quantizer 108 with hysteresis may be described, in one example, by the following:

$$Y(z)=1 \text{ if } \{Y(z)=-1 \text{ and } I(z)>0.2\} \text{ or } \{Y(z)=1 \text{ and } I(z)>-0.2\}, \text{ else } Y(z)=-1.$$

The effect of hysteresis may provide a positive feedback to the quantizer 108. The relationship between the signals Y(z) and X(z), in a system with hysteresis (e.g., K>0), may be expressed as:

$$Y(z) = N(z) + \frac{X(z) - z^{-1}Y(z)}{1 - z^{-1}} + KY(z)z^{-1}$$

Solving for Y (z) provides, $$Y(z) = \frac{X(z)}{1 - Kz^{-1} + Kz^{-2}} + \frac{N(z)(1 - z^{-1})}{1 - Kz^{-1} + Kz^{-2}}$$

The addition of hysteresis generally multiplies both the signal X(z) and the noise signal N(z) of the quantizer circuit 108 by a factor of $1/(1-Kz^{-1}+Kz^{-2})$.

Figure 4:
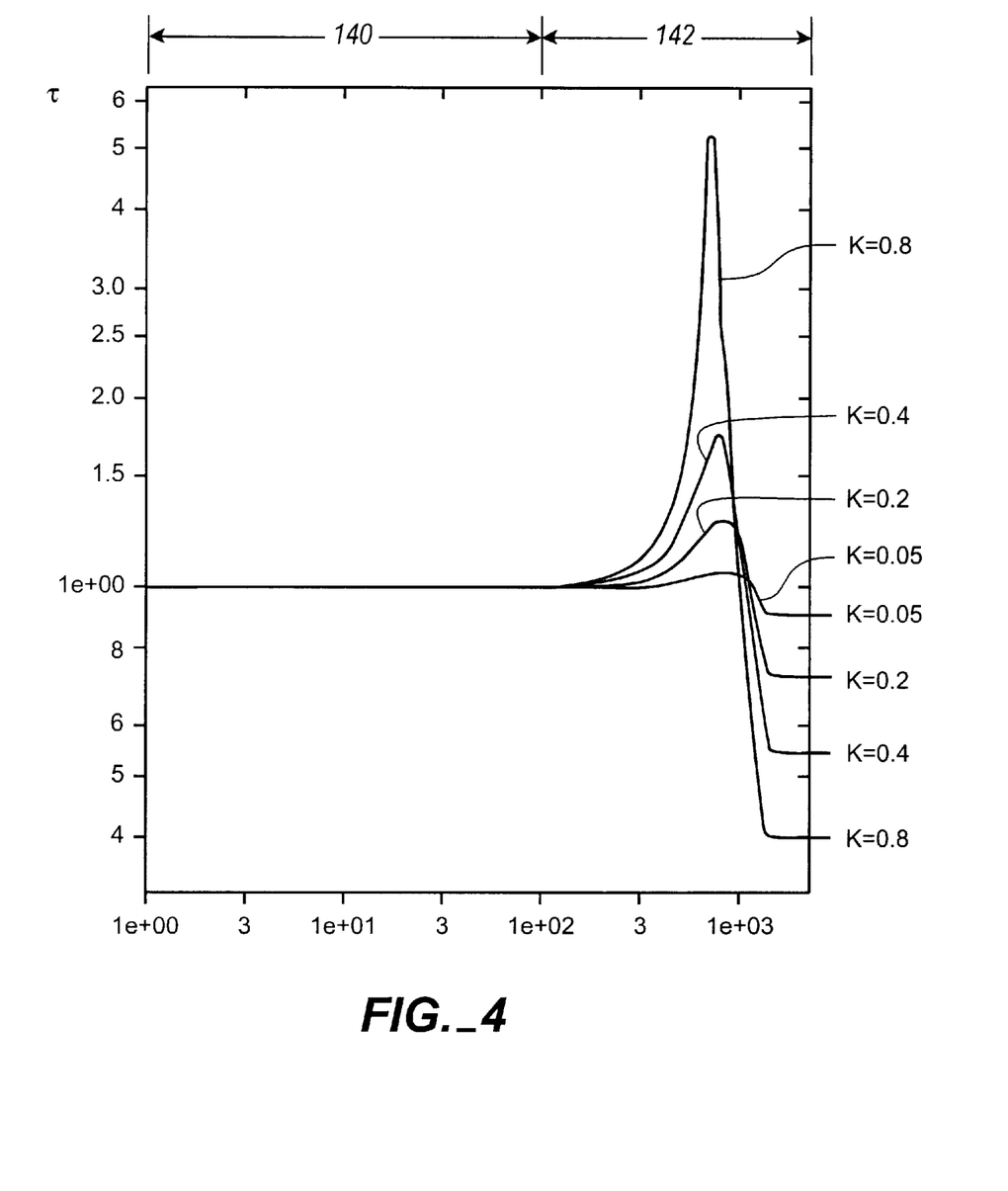
FIG. 4 is a graph illustrating an effect of various amounts of hysteresis.

Referring to FIG. 4, a graph illustrating magnitudes of the hysteresis factor $1/(1-Kz^{-1}+Kz^{-2})$ for different values of K is shown. The graph of FIG. 4 is shown on a log-log scale. The effect of the hysteresis is generally very small at low frequencies (e.g., portion 140). However, at higher frequencies the effect of the hysteresis may become more pronounced depending on the value of K and the frequency of oscillation (e.g., potion 142). For many systems, the effects of adding hysteresis may provide acceptable frequencies. However, certain high frequencies may not be of interest. In such cases, the high frequencies may be filtered out (e.g., by providing a low-pass filter on the output). In one example, the slight gain at higher frequencies may be used to cancel some of the roll-off from such a low-pass filter placed at the output.

As hysteresis increases, the signal OUTPUT generally has fewer transitions. An example of reductions in the number of output transitions for some values of K is shown in the following TABLE 1.

TABLE 1

| GAIN K | OUTPUT TRANSITIONS |
|---|---|
| 0 | 91378 |
| 0.05 | 88938 |
| 0.20 | 79764 |
| 0.40 | 64705 |
| 0.80 | 45019 |

When K=0.80, the number of transitions is generally cut in half, but the noise floor generally only increases by about 5 dB in the region of interest. The number of transitions may be cut in half also by reducing the sampling frequency by one octave. However, reducing the sampling frequency generally increases the noise floor in the region of interest by about 15 dB.

The circuit 100 may have a potential instability in the transfer function as K approaches a value of 1. However, the quantizer 108 may be implemented as a non-linear element to limit such potential instability. However, in certain design applications, such potential instability (e.g., as predicted by linear analysis) may not present a problem, even for values of K>1.

Figure 5:
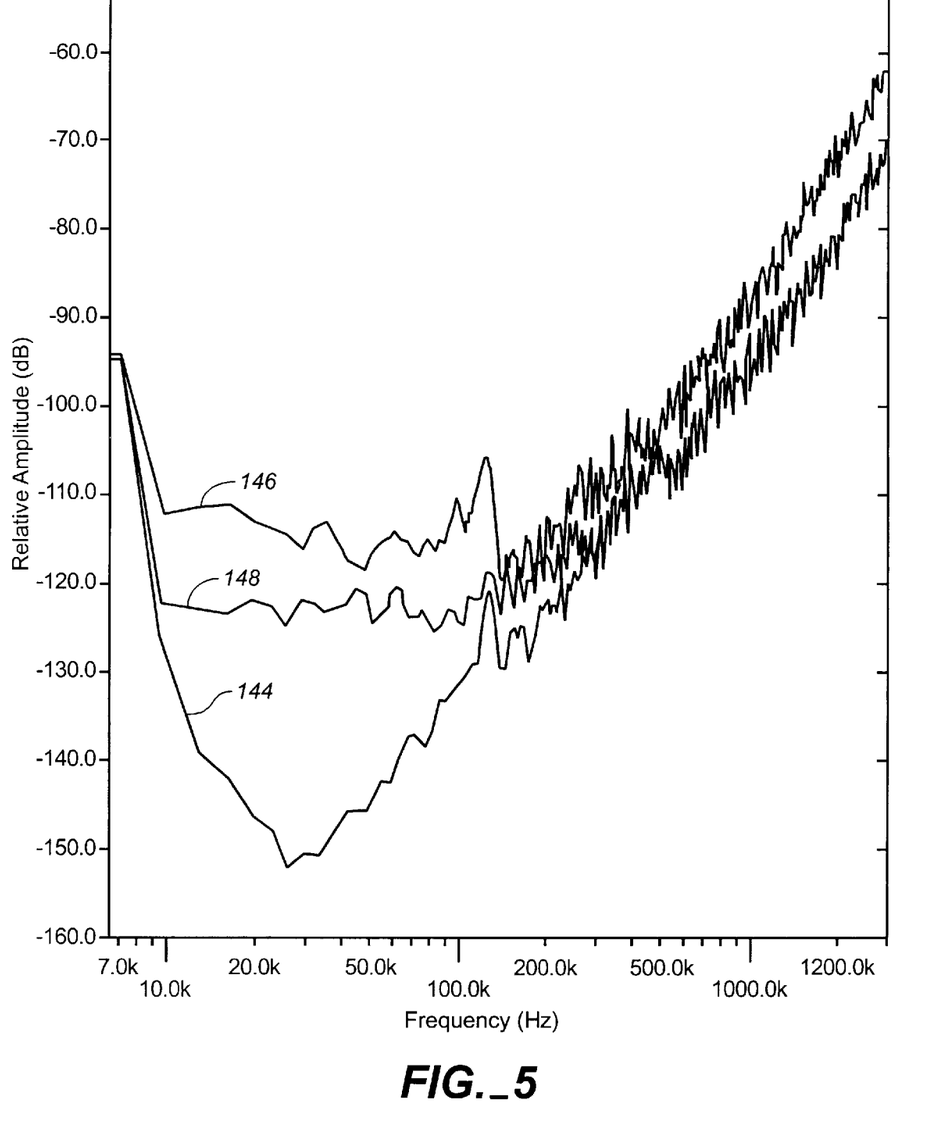
FIG. 5 is a chart illustrating an operation of a circuit of FIG. 3.

Referring to FIG. 5, a graph illustrating effects of hysteresis generally on nonlinear distortion is shown. A simulation model of the circuit 100 may be constructed using a software program (e.g., SpectraLAB from Sound Technology Inc.) to predict operation. For example, by increasing the signal Y(z) by 1% at a zero-to-one transition, the simulation generally models the effect of an output buffer with a faster rise time than fall time.

In one example, a sampling frequency (e.g., 27 MHz) and a frequency range of interest (e.g., 24 kHz) may be chosen. Before the 1% increase, the noise floor is generally measured at about −150 dB in the range of interest (e.g., trace 144). After the 1% increase, the noise floor generally rises to about −110 dB (e.g., trace 146). When hysteresis is added with a K=0.80, the noise floor generally decreases to slightly below −120 dB (e.g., trace 148).

Simulations of the circuit 100 implemented as a second-order sigma-delta one-bit D/A converter generally produce the results summarized in the following TABLES 2 and 3:

TABLE 2

| GAIN K | OUTPUT TRANSITIONS | NOISE FLOOR (dB) |
|---|---|---|
| 0 | 92216 | −110 |
| 1 | 39639 | −177 |
| 2 | 24650 | −123 |
| 4 | 14046 | −123 |
| 6 | 9798 | −122 |

TABLE 3

| SAMPLING RATE (MHz) | OUTPUT TRANSITIONS | NOISE FLOOR (dB) |
|---|---|---|
| 25 | 92216 | −110 |
| 12.5 | 46108 | −114 |
| 6.25 | 23054 | −107 |
| 3.125 | 11527 | −101 |

TABLE 2 generally illustrates the effect of various amounts of hysteresis when a sampling frequency of 25 MHz has been selected and the output driver has a 1% error on rising edges. TABLE 3 generally illustrates the effect of varying sampling frequency without providing hysteresis.

Comparing values in TABLES 2 and 3, the best noise floor value with hysteresis is generally about 9 dB better than the best noise floor value from changing the sampling rate (e.g., a hysteresis value of 4 in TABLE 2 versus a sampling frequency of 12.5 MHz in TABLE 3).

In general, changing the sampling rate may have two effects. The 1% error from nonlinearities in the output stage may be reduced by about 6dB each time the oversampling rate is cut in half. The reduction in the error from nonlinearities in the output stage may be similar for cutting the sampling frequency in half and reducing the output transitions by half with hysteresis. However, the signal to error ratio for a second-order system may be approximated by $$\left(\frac{S}{E}\right)(dB) = 6.02(N + 2.5L) - 11.4$$

(where N=number of quantization bits, and L=octaves of oversampling). Cutting the sampling rate in half may reduce the signal to error ratio by about 15 db.

Figure 6:
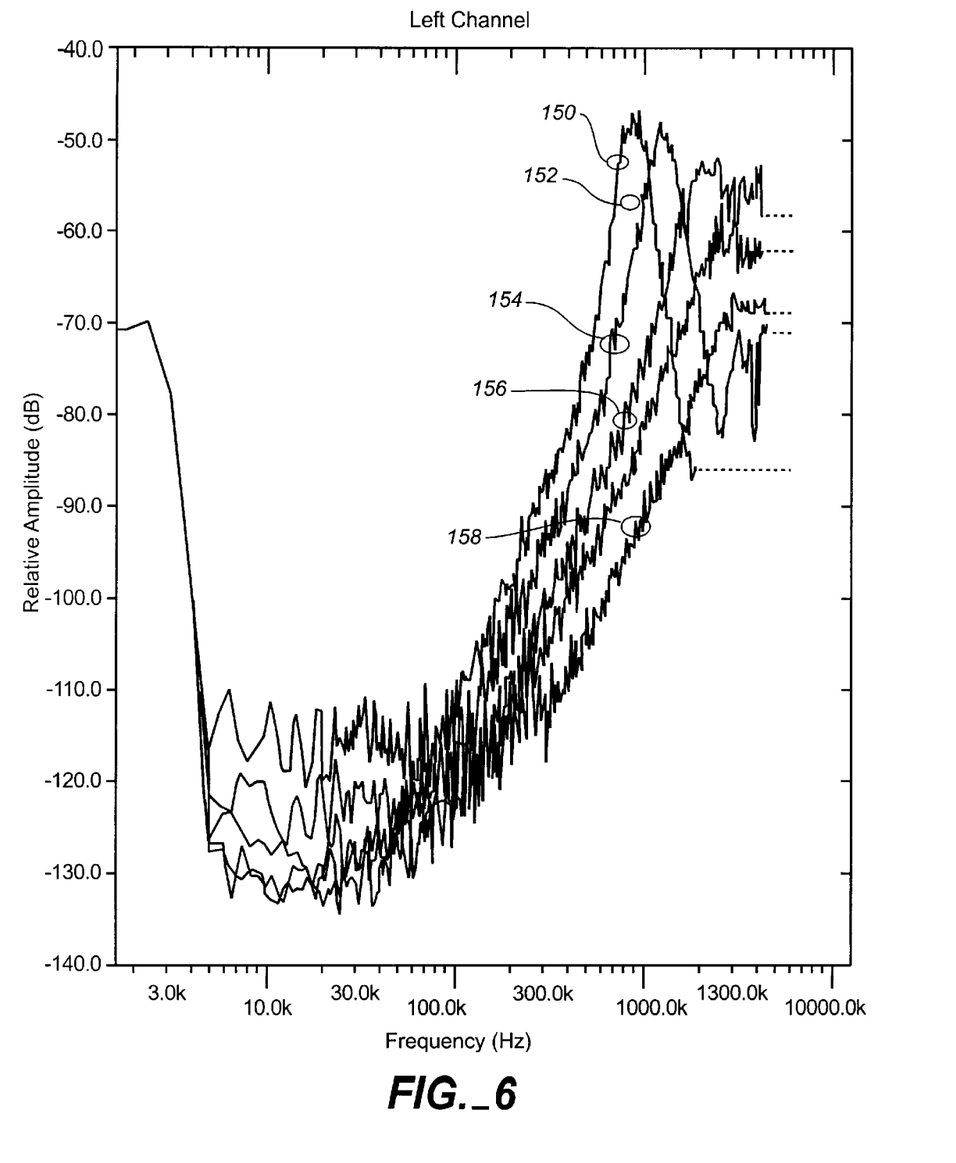
FIG. 6 is a chart illustrating an effect of various hysteresis factors.

Referring to FIG. 6, a graph illustrating simulation models of the circuit 100 using the gain values of TABLE 2 and a 1% nonlinearity in the output is shown. When the gain value is 0, the noise floor is generally about −110 dB (e.g., trace 150). When the gain value is 1, the noise floor is about −123 dB (e.g., trace 152). When the gain value is 2, the noise floor is about −123 dB (e.g., trace 154). When the gain value is 4, the noise floor is about −123 dB (e.g., trace 156). When the gain value is 6, the noise floor is generally about −122 dB (e.g., trace 158). The example values for K in TABLE 2 and FIG. 6 were generally chosen to cover a range of output transitions similar to the range of output transitions in TABLE 3.

Figure 7:
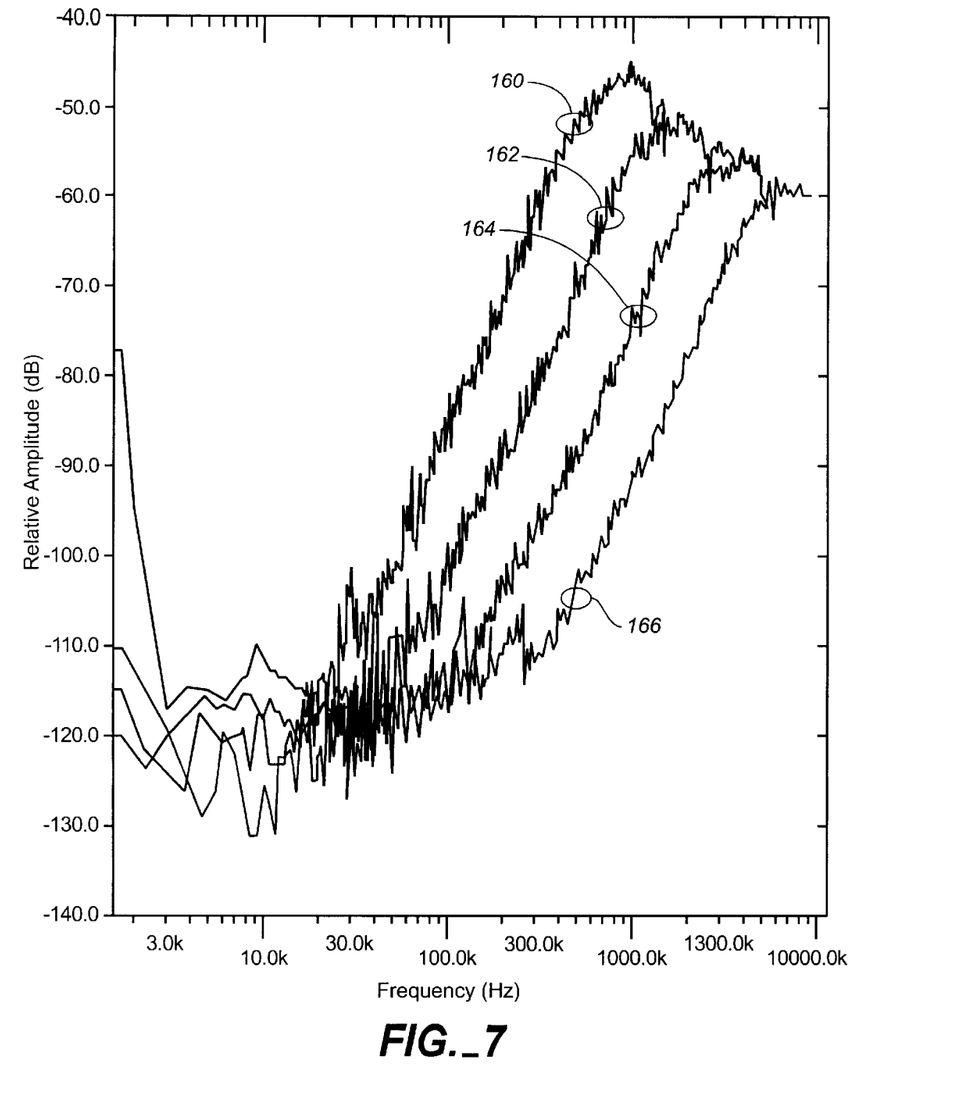
FIG. 7 is a chart illustrating an effect of various sampling frequencies.

Referring to FIG. 7, a graph illustrating simulation models of the circuit 100 using the sampling frequencies of TABLE 3 and a 1% nonlinearity in the output is shown. When a sampling frequency of about 25 MHz is used, the noise floor is generally about −110 dB (e.g., trace 160). When a sampling frequency of about 12.5 MHz, the noise floor is generally about −114 dB (e.g., trace 162). When a sampling frequency of about 6.25 MHz is used, the noise floor is generally about −107 dB (e.g., trace 164). When a sampling frequency of about 3.125 MHz is used, the noise floor is generally about −101 dB (e.g., trace 166).

Implementing hysteresis in the quantizer 108 may provide a simple method and/or architecture for reducing the number of transitions of the quantizer 108 in a sigma-delta D/A converter. While such hysteresis may provide some distortion in the output signal, for large amounts of oversampling, the distortion is generally fairly small. Reducing the number of transitions of the quantizer 108 may be useful for reducing power and/or for reducing effects of nonlinearities that may be associated with the transitions at the output of quantizer 108. As shown by FIGS. 6 and 7, adding hysteresis may provide better results than reducing oversampling.

Figure 8:
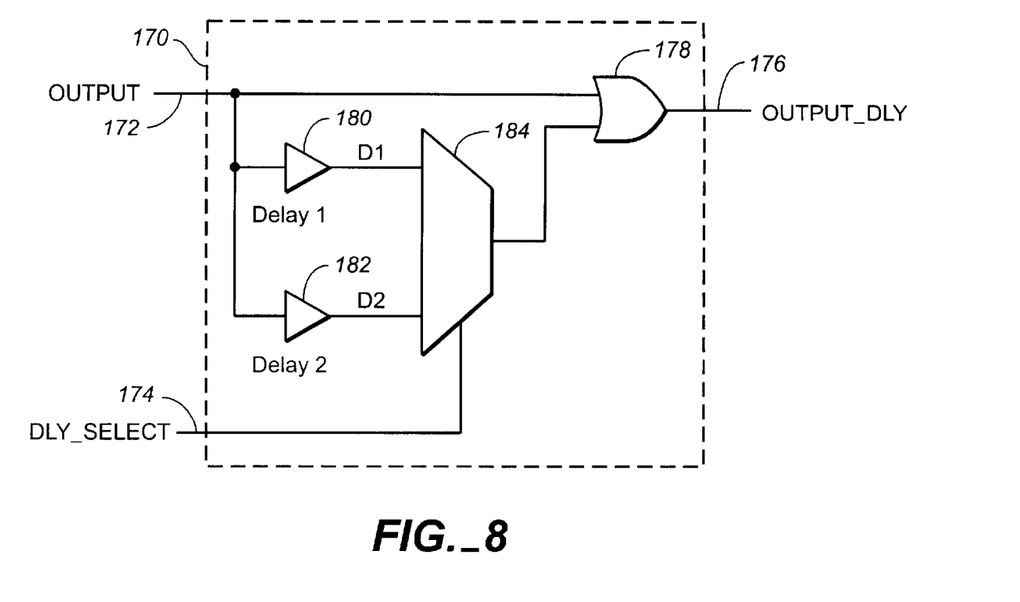
FIG. 8 is detailed block. diagram of an edge delay circuit that may be implemented in conjunction with the present invention.

Referring to FIG. 8, a block diagram of a circuit 170 illustrating an edge-delaying circuit is shown. In some situations, certain nonlinearities in an output pin may be known. Known nonlinearities may be corrected, in one example, by delaying a transition of the signal OUTPUT. When implemented in conjunction with the timing diagram in block 22 of FIG. 2 (illustrating a slow rise time) or with the circuit 100 of FIG. 3, an edge-delay circuit 170 may be used to compensate for such known nonlinearities. The circuit 170 may have an input 172 that may receive the signal OUTPUT, an input 174 that may receive a selection signal (e.g., DLY_SELECT) and an output 176 that may present a signal (e.g., OUTPUT_DLY). The circuit 170 may be configured to delay the falling edges of the signal OUTPUT by a predetermined delay selected by the signal DLY_SELECT. The amount of delay may be chosen, in one example, to compensate for the slow rise time of the zero to one transitions of the signal OUTPUT.

The circuit 170 may comprise, in one example, a gate 178, a delay line 180, a delay line 182 and a multiplexer 184. The gate 178 may be implemented, in one example, as an OR gate. However, other types of gates and/or different numbers of inputs may be implemented to meet the design criteria of a particular implementation. The signal OUTPUT may be presented to a first input of the gate 178, an input of the delay line 180, and an input of the delay line 182. An output of the delay line 180 may be presented to a first input of the multiplexer 184. An output of the delay line 182 may be presented to a second input of the multiplexer 184. An output of the multiplexer 184 may be presented to a second input of the gate 178. The signal OUTPUT_DLY may be presented at an output of the gate 178.

The signal DLY_SELECT may be presented to a control input of the multiplexer 184. The multiplexer 184 generally presents a signal to the second input of the gate 178 by selecting either the output of the delay line 180 or the output of the delay line 182.

Figure 9:
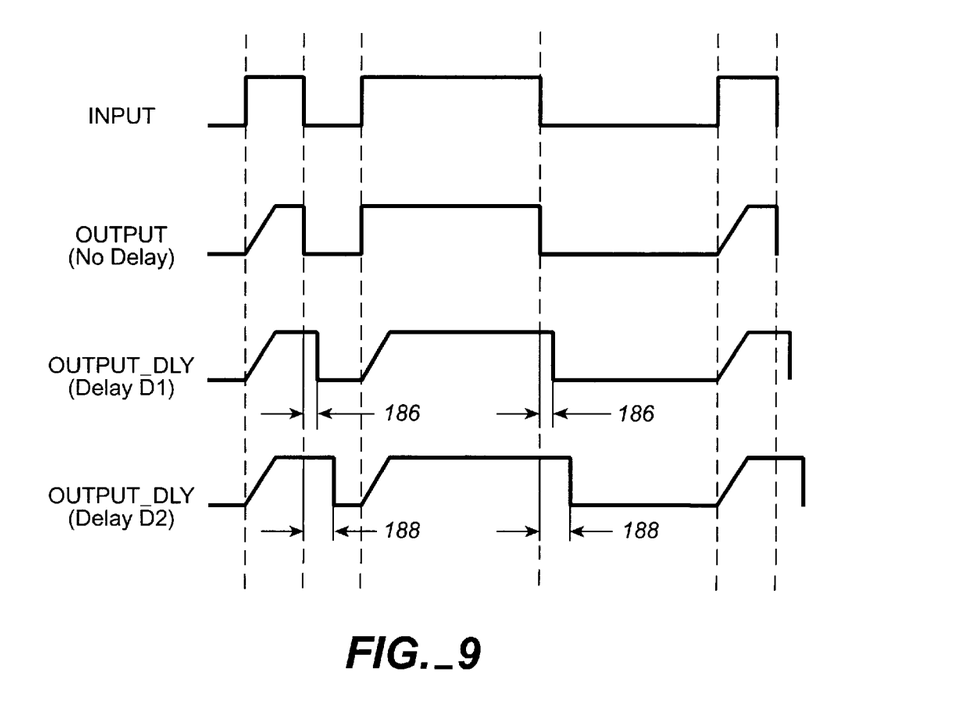
FIG. 9 is a timing diagram illustrating an example operation of the circuit of FIG. 6.

Referring to FIG. 9, a timing diagram illustrating an example operation of the circuit 170 is shown. The output rise/fall times may be roughly equalized by adjusting the delay in the edge-delay circuit 170 (e.g., portions 186 and 188). Adjusting the delay generally requires some knowledge of the nonlinearity in the output. The circuit 170 may be useful for correcting unequal rise/fall times in specific buffers in a specific technology. The technique of delaying rise/fall times may complement the hysteresis technique for correcting unknown nonlinearities due to fluctuations in process or temperature.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate an intermediate signal in response to an input signal and a first feedback signal;
   a quantizer circuit configured to (i) receive said intermediate signal and a second feedback signal and (ii) generate an output signal in response to said intermediate signal and said second feedback signal, wherein said output signal has a predetermined amount of hysteresis with respect to said intermediate signal; and
   a third circuit configured to generate said first feedback signal and said second feedback signal in response to said output signal.

2. The apparatus according to claim 1, further comprising a fourth circuit configured to generate a delay in a falling edge of said output signal in response to a control signal.

3. The apparatus according to claim 2, wherein said fourth circuit is configured to select between two or more delay factors.

4. The apparatus according to claim 1, wherein said first circuit comprises an integrator circuit.

5. The apparatus according to claim 1, wherein said quantizer circuit is further configured to vary said amount of hysteresis in said output signal in response to said second feedback signal.

6. The apparatus according to claim 1, wherein said quantizer circuit comprises a 1-bit quantizer circuit.

7. The apparatus according to claim 1, wherein said first feedback signal and said second feedback signal are related by a predetermined gain factor.

8. The apparatus according to claim 7, wherein said gain factor is less than 1.

9. The apparatus according to claim 1, wherein said apparatus has a transfer function of:

$$Y(z) = \frac{X(z)}{1 - Kz^{-1} + Kz^{-2}} + \frac{N(z)(1 - z^{-1})}{1 - Kz^{-1} + Kz^{-2}}.$$

10. The apparatus according to claim 1, wherein:
    said first circuit comprises a sigma-delta modulator configured to generate said intermediate signal by integrating a difference signal generated in response to said input signal and said first feedback signal; and
    said third circuit comprises (i) a feedback circuit configured to generate said first feedback signal in response to said output signal and (ii) an amplifier circuit configured to generate said second feedback signal in response to said first feedback signal, wherein said amplifier circuit has a predetermined gain.

11. The apparatus according to claim 1, further comprising:
    a fourth circuit comprising a logic gate, a first delay line, a second delay line, and a multiplexer, wherein:
      said output signal is coupled to an input of said first and second delay lines and a first input of said logic gate;
      an output of said first delay line is coupled to a first input of said multiplexer;
      an output of said second delay line is coupled to a second input of said multiplexer;
      an output of said multiplexer is coupled to a second input of said logic gate, wherein said multiplexer selects between said output of said first delay line and said output of said second delay line in response to a command signal; and
      a falling edge of said output signal is delayed in response to a logical combination of said output signal and said output of said multiplexer.

12. An apparatus comprising:
    means for generating an intermediate signal in response to an input signal and a first feedback signal;
    means for generating a quantized output signal in response to said intermediate signal and a second feedback signal, wherein said output signal has a predetermined amount of hysteresis with respect to said intermediate signal; and
    means for generating said first feedback signal and said second feedback signal in response to said output signal.

13. The apparatus according to claim 12, further comprising:
    means for generating a delay in a falling edge of said output signal in response to a control signal.

14. A method for providing hysteresis in an oversampled data converter comprising the steps of:
    (A) generating an intermediate signal in response to an input signal and a first feedback signal;
    (B) generating a quantized output signal in response to said intermediate signal and a second feedback signal, wherein said output signal has a predetermined amount of hysteresis with respect to said intermediate signal; and
    (C) generating said first feedback signal and said second feedback signal in response to said output signal.

15. The method according to claim 14, further comprising the step of:
    (D) delaying a falling edge of said output signal in response to a control signal.

16. The method according to claim 15, wherein step (D) further comprises the sub-steps of:
    (D-1) receiving said output signal at an input of one or more delay lines;
    (D-2) selecting an output of said one or more delay lines in response to a control signal; and
    (D-3) logically combining said output signal with a signal generated at said output selected in sub-step (D-2).

17. The method according to claim 14, wherein step (A) comprises the sub-steps of;
    (A-1) generating a difference signal in response to said input signal and said first feedback signal; and
    (A-2) integrating said difference signal.

18. The method according to claim 14, wherein step (B) comprises the sub-step of quantizing said intermediate signal.

19. The method according to claim 14, wherein said step (C) comprises the sub-steps of:
    (C-1) generating said first feedback signal in response to said output signal using a feedback network having a transfer function of $Z^{-1}$; and
    (C-2) generating said second feedback signal in response to said first feedback signal using an amplifier circuit having a predetermined gain.

20. The method according to claim 14, comprising the sub-steps of:
    (A-1) generating a difference signal in response to said input signal and said first feedback signal;
    (A-2) integrating said difference signal using an integrator having a transfer function of $1/(1-Z^{-1})$;
    (C-1) generating said first feedback signal in response to said output signal using a feedback network having a transfer function of $Z^{-1}$; and
    (C-2) generating said second feedback signal in response to said first feedback signal using an amplifier circuit having a predetermined gain.

* * * * *